United States Patent [19]

Lucas

[11] Patent Number: 5,550,844
[45] Date of Patent: Aug. 27, 1996

[54] PRINTED CIRCUIT BOARD FAULT INJECTION CIRCUIT

[75] Inventor: Brian K. Lucas, Avon, England

[73] Assignee: Proteus Corporation, Littleton, Colo.

[21] Appl. No.: 187,783

[22] Filed: Jan. 25, 1994

Related U.S. Application Data

[63] Continuation of Ser. No. 978,752, Nov. 19, 1992, abandoned.

[51] Int. Cl.$^6$ ................................................ G01R 31/28
[52] U.S. Cl. ................................. 371/22.6; 324/73.1
[58] Field of Search ......................... 371/22.6, 23, 73.1, 371/25.1, 27

[56] References Cited

U.S. PATENT DOCUMENTS

| | | | |
|---|---|---|---|
| 3,772,595 | 11/1973 | De Wolf et al. | 371/25.1 |
| 4,439,858 | 3/1984 | Peterson | 371/22.6 |
| 4,727,317 | 2/1988 | Oliver | 371/20 |
| 4,759,019 | 7/1988 | Bentley et al. | 371/23 |
| 4,918,385 | 4/1990 | Shreeve | 371/22.6 |
| 5,124,647 | 6/1992 | Watts | 324/73.1 |
| 5,126,659 | 6/1992 | Edwards | 324/73.1 |
| 5,212,442 | 5/1993 | O'Toole et al. | 324/201 |

Primary Examiner—Robert W. Beausoliel, Jr.
Assistant Examiner—Trinh L. Tu
Attorney, Agent, or Firm—Duft, Graziano & Forest, P.C.

[57] ABSTRACT

The printed circuit board fault injection circuit uses an automated fixture to enable a robot arm mechanism to position a probe at a designated test node on the printed circuit board under test and apply a fault signal thereto. The test apparatus ensures that the designated node is in contact with the fault injector probe and controllably applies a voltage and/or current signal of selected magnitude to the test node to typically create a stuck-at-one or a stuck-at-zero fault or any other definable condition. The fault injector probe produces a stuck-at-zero fault that is not subject to spurious high frequency harmonics by extending the dynamic range of the fault injector circuit to apply a negative voltage to the test node to rob the output stage of the logic circuit that drives the test node of all drive current, thereby forcing a solid stuck-at-zero condition. Additional monitoring circuitry is provided to detect excessive current drain from the fault injector circuit into the test node to avoid causing damage to the printed circuit board under test.

6 Claims, 2 Drawing Sheets

PRINTED CIRCUIT BOARD FAULT INJECTION CIRCUIT

This application is a continuation of application Ser. No. 07/978,752, filed Nov. 19, 1992, now abandoned.

FIELD OF THE INVENTION

This invention relates to automated testing of printed circuit boards and, in particular, to apparatus for applying voltage and/or current signals of predetermined magnitude and timing to designated loci on a printed circuit board under test.

PROBLEM

It is a problem in the field of automated printed circuit board testing to simply and inexpensively perform rigorous and complete testing of a printed circuit board, including all possible fault modes. Faults in a printed circuit board containing digital circuitry are generally either stuck-at-one or stuck-at-zero conditions. Existing printed circuit board test facilities comprise "bed of nails" test fixtures that force a matrix of spring loaded test pins against the printed circuit board under test to access the conductive pads formed thereon. The printed circuit board test facility then applies a predetermined vector of drive signals to the circuitry on the printed circuit board under test and measures the response of the circuit to these test vectors.

A problem with this mode of testing is that the printed circuit board test facility does not inject faults into the circuit under test, but simply checks for normal operation. It is important to develop a data set of information relating to failure modes of the printed circuit board under test in response to faults of a predetermined nature. Some circuits are also designed to be fault tolerant wherein they self-diagnose and recover from minor faults and this recovery capability must be tested during the manufacturing process to ensure the operational integrity of the circuit under test. However, existing test circuits cannot accurately simulate the stuck-at-one or stuck-at-zero conditions and precisely apply these faults to an identified locus on the printed circuit board under test.

SOLUTION

The above described problems are solved and a technical advance achieved in the field by the printed circuit board fault injection circuit of the present invention. This apparatus uses an automated fixture that secures the printed circuit board under test in a predefined location to enable a robot arm mechanism to position a probe at a designated locus, representing a test node, on the printed circuit board under test and apply a fault signal thereto. The test apparatus includes a pad detect circuit that measures the contact integrity between the fault injector probe and the printed circuit board node to be tested to ensure that the designated node is in contact with the fault injector probe. Once contact is made, the fault injector probe controllably applies a voltage and/or current signal of selected magnitude and timing to the test node to typically create a stuck-at-one or a stuck-at-zero fault or any other definable condition. The circuitry of the fault injector probe is designed to produce a stuck-at-zero fault that is not subject to spurious high frequency harmonics of the signal normally produced at the test node by the printed circuit board under test. This is accomplished by extending the dynamic range of the fault injector circuit to apply a negative voltage to the test node to rob the output stage of the logic circuit that drives the test node of all drive current, thereby forcing a solid stuck-at-zero condition. Additional monitoring circuitry is provided to detect excessive current drain from the fault injector circuit into the test node to avoid the possibility of the fault injector drive current causing damage to the printed circuit board under test.

DETAILED DESCRIPTION

The printed circuit board fault injection circuit of the present invention uses an automated test fixture that secures the printed circuit board under test in a predefined location to enable a robot arm mechanism to position a probe at a designated locus, representing a test node, on the printed circuit board under test and apply a fault signal thereto. The fault injector probe is mounted on an x-y positioning mechanism of conventional design (not shown) wherein the surface of a printed circuit board under test mounted in the test fixture lies in the xy plane. The fault injector probe is positionable over a selected point on the printed circuit board under test by means of a number of probe positioning elements such as z axis positioning rails, x axis positioning rails and y axis positioning rails. The fault injector probe is driven along these three sets of rails by corresponding motors in the z, x and y axes respectively. Thus, by activating any combination of these motors, the position of the fault injector probe with respect to the printed circuit board under test can be precisely controlled in well known fashion via the positioning rails and their associated motors.

Figure 1:
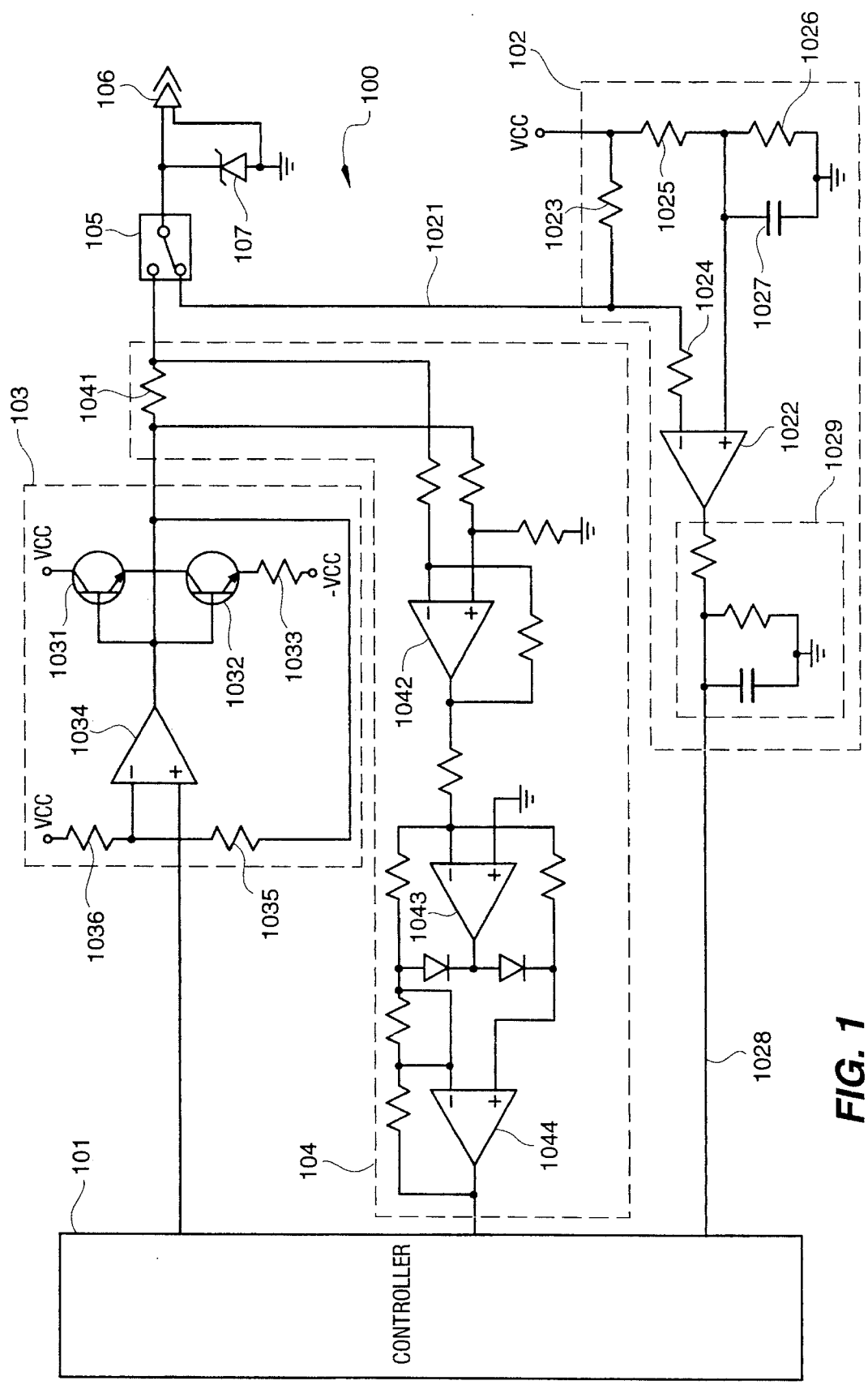
FIG. 1 illustrates the overall architecture of the fault injector probe circuit.

The fault injector probe consists of the fault injector circuit 100 illustrated in FIG. 1 and associated mechanical components (not shown) used to apply the signals generated by the fault injector circuit 100 to the test node of the printed circuit board under test. The mechanical components are not illustrated herein for simplicity of description and can be a conventional probe tip apparatus whose specifics are dictated by the positional accuracy required to test this printed circuit board, such as a spring contact (pogo pin) probe, that can be used to establish mechanical and electrical contact between the output of the fault injector circuit and the test node which is a component pin or conductive pad formed on the printed circuit board.

Fault Injector Circuit Controller

The fault injector circuit 100 illustrated in FIG. 1 consists of a plurality of subsystems 101–107 that are cooperatively operative to precisely generate and apply the test signals to the test node via the probe tip 106. The controller 101 consists of a processor element that defines the magnitude and timing of a test signal to be generated and monitors the application of the test signal to a specified test node on the printed circuit board under test that is mounted in the test fixture. Controller 101 is programmable to produce a fault voltage of controllable magnitude, a fault current of controllable magnitude, a fault of controllable time duration, a time delay of controllable duration prior to the application of a fault to the printed circuit board under test. The controller 101 can operate under stored program control to execute a series of test operations or can be single-stepped via user input using a keyboard.

Pad Detect Circuit

Pad detect circuit 102 has its input terminals 1021 connected to one set of contacts of relay 105 to identify when the probe tip 106 makes contact with a test node on the printed circuit board under test. The common terminal of relay 105 is directly connected to the probe tip 106 and when relay 105 is operated in a first state by controller 101, the probe tip 106 is connected to pad detect circuit 102. The pad detect circuit 102 measures the contact integrity between the error injector circuit 100 and the test node on the printed circuit board under test.

The bridge amplifier configuration of pad detect circuit 102 illustrated in FIG. 1 uses two sets of voltage divider elements 1023–1024, 1025–1027 to create reference voltages for the inverting and noninverting inputs, respectively, of operational amplifier 1022. When the probe tip 106 makes contact with the conductive surface of the test node on the printed circuit board under test, the voltage on the inverting input of operational amplifier 1022 drops as a function of the family of devices (TTL, CMOS, ECL, etc.) mounted on the printed circuit board under test and the respective current drawn from the voltage divider resistors 1023–1024 on the inverting input of operational amplifier 1022. This change in input voltage on operational amplifier 1022 causes a corresponding change in the output voltage of operational amplifier 1022, which is applied to output lead 1028 via impedance 1029. Operational amplifier 1022 operates within preset threshold limits and either no voltage drop in its output or a drop in excess of the preset limits indicates no contact with the test node or erroneous contact. Controller 101 does not initiate the fault signal generation process until proper contact is made with the test node as indicated by the voltage drop produced by the pad detect circuit 102, whose output is transmitted to controller 101 via output lead 1028.

Stuck-At-Zero Faults

Figure 2:
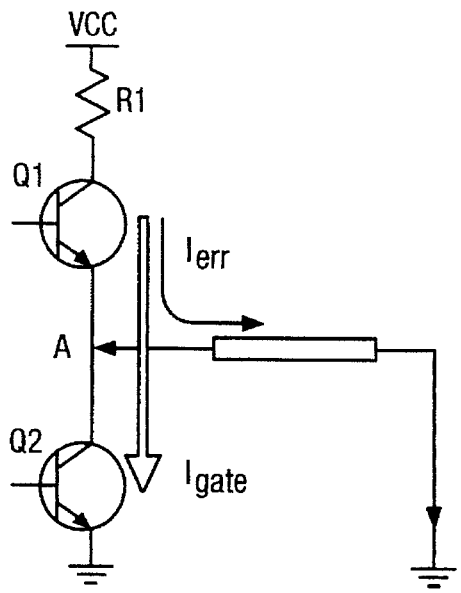
FIG. 2 illustrates a typical output stage of a device under test.

The emulation of a stuck-at-zero fault, in concept, represents the grounding of the test node to produce a low logic level at the test node. However, the application of a true ground signal to a test node via a fault injection probe is a non-trivial task. The presently used high speed logic devices, with their high drive current capacities, cannot be grounded by a probe that itself has a significant non-zero impedance. This problem is illustrated by the application of a stuck-at-zero fault to the logic device illustrated in FIG. 2. This circuit represents a TTL output stage of a 74F244 octal output driver manufactured by, for example, Fairchild Instruments Corporation. The totem-pole output stage of this device makes use of transistor Q1 as the switching element to control the current flow through pullup resistor R1 that is connected to voltage reference Vcc. When transistor Q1 is on, it creates a logic 0 output by providing a low impedance path to circuit ground for the current flowing through pullup resistor R1 and transistor Q2. When transistor Q1 is off, the current flowing through pullup resistor R1 and transistor Q2 is available to drive an element connected to the output terminal OUT.

Figure 3:
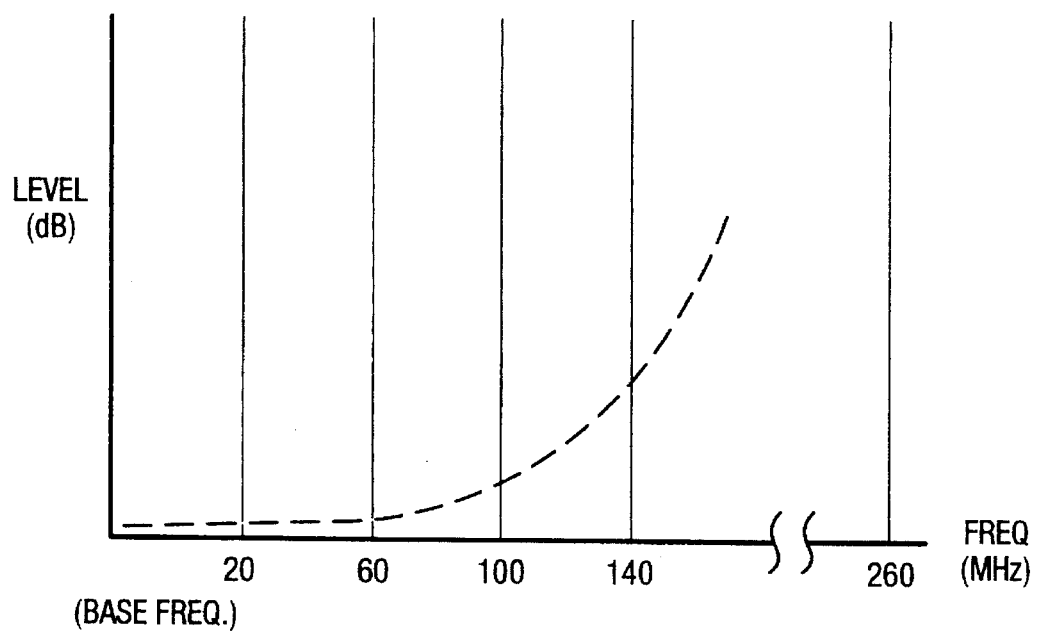
FIG. 3 illustrates the frequency spectrum of a typical clocked signal produced by the device under test.

A difficulty with this configuration is when the fault injection circuit 100 must simulate a stuck-at-zero fault at terminal OUT. The probe tip 106 and its associated ground circuit in reality presents a non-zero impedance to terminal OUT. At frequencies above 5 Mhz, the conductors in probe tip 106 act as a transmission line as shown schematically in FIG. 2 and the frequency dependent reactive impedances (inductance and capacitance) are significant factors. When transistor Q1 is on, this non-zero impedance ground in unable to rob all the current produced by pullup resistor R1/transistor Q2 and flowing through transistor Q1. The current is split into two components $I_{base}$ flowing through transistor Q1 and $I_{err}$ flowing through the probe tip. This is especially true in the case where the output of the device driver is a slow clock signal of frequency 20 Mhz, for example. The square wave output consists of the 20 Mhz fundamental frequency signal and odd harmonics. The faster the rise time of the square wave signal, the greater the amplitude of the higher order odd harmonics. The frequency spectrum of this signal is illustrated in FIG. 3, where a fast rise time (4 nsec) 20 Mhz square wave signal is plotted. It should be noted that there is a significant frequency component at the 13th harmonic, which corresponds to 260 Mhz. However, the conductors of the probe tip 106 are reactive impedances at 260 Mhz and present a non-zero impedance to the harmonic signals present on the output terminal OUT of the device driver of FIG. 2. The characteristic impedance is given by:

$$X_L = 2\pi = fL \qquad (1)$$

Using typical values of inductance as L= 0.5 uH, the impedance $X_L$ becomes 820 ohms at 260 Mhz. Thus, a sizeable portion of the output current at 260 Mhz is being carried by transistor Q1 as $I_{base}$, and not being drawn by fault injection circuit 100 as $I_{err}$, thereby defeating the purpose of applying a fault condition to the test node. Furthermore, the probe tip 106 acts as a transmission line, presenting a significant signal delay time to the application of a ground signal to the output terminal OUT. The dotted line in FIG. 3 illustrates the diminishing effect of the application of a ground signal to terminal OUT as a function of the increasing impedance of the probe tip conductors at high frequency.

Effective Grounding of Test Nodes

To overcome the problem noted above, the fault generator circuit 103 includes circuitry that presents an effective stuck-at-zero condition to the test node. The output of fault generator circuit 103 pulls the output stage of the device driver below zero volts to thereby prevent the generation of an output voltage at the output stage of the driver. This is accomplished by the use of the push-pull output stage consisting of transistors 1031–1032 and load resistor 1033, which are connected between supply voltages Vcc and −Vcc. This output stage is driven by operational amplifier 1034 with negative feedback resistor 1035 connected to the probe output and pullup resistor 1036 connected to Vcc. This configuration enables the output of fault generator 103, as driven by operational amplifier 1034, to have a greater dynamic range than 0–Vcc. In fact, the values of the elements of fault generator 103 are selected to produce a negative voltage at the output of fault generator 103 for the stuck-at-zero state. The particular output of fault generator 103 is dictated by the control signal applied to the noninverting input of operational amplifier 1033 by controller 101, and can be selected to be stuck-at-zero, stuck-at-one or any level therebetween.

Fault generator 103 produces a negative output voltage for a stuck-at-zero condition, which output voltage is carried through a set of contacts of relay 105, when relay 105 is in a second state, to probe tip 106. The application of a negative voltage to a test node on the printed circuit board under test holds the output of the device driver illustrated in FIG. 2 below the logic zero level. This negative voltage produced by fault generator 103 causes all the current flowing through transistor Q2 to be directed to fault injector circuit 100 rather than through transistor Q1, since the effective non-zero impedance of the probe tip 106 and its conductors has been compensated for by the negative voltage produced by fault generator 103. The current available to switching transistor Q1 is therefore zero and even if transistor Q1 switches, the output seen at the output terminals OUT of the device driver remains at logic zero due to the negative voltage produced by fault generator 103. A Zener diode 107 is added in parallel to the probe-ground circuit to clamp the negative voltage at a predetermined level and to also protect the device driver from positive overvoltages. This configuration eliminates the effects of the reactive characteristics of the conductors in the fault injection circuit 100 probe tip 106 and ensures proper operation of the fault injection circuit 100 not only at the fundamental frequency, but also at all higher order harmonics of the fundamental frequency. Only the resistive characteristics of the conductors remain and these are of negligible effect.

Fault Detection Circuit

To prevent the fault signals generated by the fault generator 103 from potentially damaging the printed circuit board under test in the event that a fault exists on the printed circuit board under test, fault detection circuit 104 is provided to monitor the voltage and current signals applied to the selected test node by the fault injection circuit 100. In particular, resistor 1041 is inserted in series in the output of fault generator 103 to produce a voltage across its terminals indicative of the magnitude of the current that is flowing from the output of fault generator 103. This generated voltage is measured by differential amplifier 1042, whose output is applied through signal conditioning amplifiers 1043–1044 to controller 101. The signal returned to controller 101 via fault detection circuit 104 is indicative of the magnitude of the current being applied to the test node on the printed circuit board under test by the fault injection circuit 100. If the measured current flow is inconsistent with the value expected for the device type being tested, controller 101 terminates the operation of fault generator 103 to ensure that the test signal does not damage the printed circuit board under test.

SUMMARY

In summary, the apparatus of the present invention controllably creates fault conditions at a selected test node on a printed circuit board under test by simulating a stuck-at-fault condition for any desired voltage. To eliminate the problem of higher order harmonics of a square wave signal of fundamental frequency failing to be grounded due to the non-zero reactive impedance characteristics of the fault injection probe at higher frequencies, a negative voltage is output to effectively ground the test node. The negative voltage eliminates the effects of reactive impedance characteristics and ensures a stuck-at-zero condition at the test node.

While a specific embodiment of this invention has been disclosed, it is expected that those skilled in the art can and will design alternate embodiments of this invention that fall within the scope of the appended claims.

I claim:

1. Apparatus for driving a test node on a printed circuit board under test to logic zero, wherein said printed circuit board under test operates between first and second predetermined voltages representative of logic one and logic zero states, respectively, said first predetermined voltage being greater in magnitude than said second predetermined voltage, comprising:

means, located external to said printed circuit board under test, for generating a drive signal voltage of predetermined fixed magnitude, whose value is less than said second predetermined voltage representative of logic zero; and means for directly applying said drive signal voltage of fixed magnitude to said test node on said printed circuit board under test via a probe lead to drive voltage at said test node to a value representative of said logic zero while said printed circuit board is powered to operate between said first and second predetermined voltages.

2. The apparatus of claim 1 further comprising:

means connected to said directly applying means and operable to prevent a voltage of said test node from falling below a predetermined threshold, said predetermined threshold being less than zero and lesser in magnitude than said drive signal voltage produced by said generating means.

3. The apparatus of claim 1 further comprising:

means for determining whether an electrically conductive path exists between said directly applying means and said test node; and means, responsive to the absence of an electrically conductive path between said directly applying means and said test node, for disabling said generating means.

4. Apparatus for grounding a test node on a circuit under test, wherein said circuit under test operates between a first predetermined voltage representative of a first logic state and circuit ground voltage representative of a second logic state, comprising:

means, located external to said printed circuit board under test, for generating a drive signal voltage predetermined fixed magnitude, said drive signal voltage being less than zero volts in magnitude; and means for directly applying said drive signal voltage of fixed magnitude to said test node on said circuit under test to drive voltage at said test node to a value representative of one of said respective first and second logical states while said printed circuit board is powered to operate between said first voltage and said ground voltage.

5. The apparatus of claim 4 further comprising:

means connected to said directly applying means and operable to prevent a voltage of said test node from falling below a predetermined threshold, said predetermined threshold being less than zero and lesser in magnitude than said drive signal voltage produced by said generating means.

6. The apparatus of claim 4 further comprising:

means for determining whether an electrically conductive path exists between said directly applying means and said test node; and means, responsive to the absence of an electrically conductive path between said directly applying means and said test node, for disabling said generating means.

* * * * *